US008137459B2

(12) United States Patent  
Paton et al.

(10) Patent No.: US 8,137,459 B2  
(45) Date of Patent: Mar. 20, 2012

(54) METHOD FOR PRODUCING NANOPARTICLES FOR MAGNETIC FLUIDS BY ELECTRON-BEAM EVAPORATION AND CONDENSATION IN VACUUM, A MAGNETIC FLUID PRODUCING METHOD AND MAGNETIC FLUID PRODUCED ACCORDING TO SAID METHOD

(75) Inventors: Boris Paton, Kiev (UA); Boris Movchan, Kiev (UA); Iurii Kurapov, Kiev (UA)

(73) Assignee: State Enterprise "International Center For Electron Beam Technologies of E.O. Paton Electric Welding Institute of National Academy of Sciences of Ukraine", Kiev (UA)

( * ) Notice: Subject to any disclaimer, the term of this patent is extended or adjusted under 35 U.S.C. 154(b) by 0 days.

(21) Appl. No.: 12/667,472

(22) PCT Filed: Aug. 22, 2007

(86) PCT No.: PCT/UA2007/000048  
§ 371 (c)(1),  
(2), (4) Date: Feb. 24, 2010

(87) PCT Pub. No.: WO2009/005484  
PCT Pub. Date: Jan. 8, 2009

(65) Prior Publication Data  
US 2011/0001079 A1 Jan. 6, 2011

(30) Foreign Application Priority Data  
Jul. 4, 2007 (UA) ................ A200707529

(51) Int. Cl.  
*C30B 29/62* (2006.01)

(52) U.S. Cl. .......... 117/89; 117/105; 117/108; 117/109; 117/940

(58) Field of Classification Search .......... 117/89, 117/109, 108, 105, 940  
See application file for complete search history.

(56) References Cited

U.S. PATENT DOCUMENTS 5,665,277 A   9/1997 Johnson et al.  
(Continued)

FOREIGN PATENT DOCUMENTS

JP   63-38572 A   2/1988  
(Continued)

OTHER PUBLICATIONS

J. D. F Ramsay et al., "Ultrafine oxide powders prepared by electron beam evaporation", Journal of Material Science, vol. 9, (1974), pp. 1681-1688.  
Kazuo Kimoto et al., "An Electron Microscope Study on Fine Metal Particles Prepared by Evaporation in Argon Gas at Low Pressure", Jpn. J. Appl. Phys. 2, (1963), pp. 702-713, (including English language Abstract).

(Continued)

*Primary Examiner* — Bob M Kunemund  
(74) *Attorney, Agent, or Firm* — Birch, Stewart, Kolasch & Birch, LLP

(57) ABSTRACT

The inventive method for producing nanoparticles for ferrofluids by electron-beam evaporation and condensation in vacuum, consists in evaporating an initial solid material and in fixing nanoparticles to a cooled substrate by means of a solidifiable carrier during vapour condensation, wherein a solid inorganic material, which is selected from a group containing metals, alloys or oxides thereof, is used as an initial material and a solid liquid-soluble material is used as a magnetic carrier material for fixing nanoparticles. The method also consists in simultaneously evaporating the initial material and the carrier composition by electron-beam heating. The vapour is deposited on the substrate, the temperature which is lower than the melting point of the carrier material, and the condensate of the magnetic material nanoparticles, which have a size and are fixed in the carrier, is produced. The particle size is adjusted by setting the specified temperature of the substrate during vapour deposition.

5 Claims, 3 Drawing Sheets

U.S. PATENT DOCUMENTS

| | | |
|---|---|---|
| 6,858,115 B2 | 2/2005 | Azuma et al. |
| 7,338,711 B1 * | 3/2008 | Brousseau, III .............. 428/403 |
| 7,807,217 B2 * | 10/2010 | Shukla et al. ................. 427/127 |
| 2003/0115986 A1 | 6/2003 | Pozarnsky et al. |
| 2008/0075975 A1 * | 3/2008 | Glaser et al. ............... 428/693.1 |

FOREIGN PATENT DOCUMENTS

| | | |
|---|---|---|
| JP | 63-39631 A | 2/1988 |
| JP | 3-138355 A | 6/1991 |
| RU | 203516 C2 | 4/2002 |
| RU | 2 182 579 C2 | 5/2002 |

OTHER PUBLICATIONS

I. Nakatani et al., "Preparation and magnetic properties of colloidal ferromagnetic metals" Journal of Magnetism and Magnetic Materials, vol. 65, iss. 2-3, Mar. 1, 1987, pp. 261-264, (including English language Abstract).

N. H. Hai et al., "Iron and Cobalt-based magnetic fluids produced by inert gas condensation," Journal of Magnetism and Magnetic Materials, vol. 293, pp. 75-79, 2005, XP004882960.

* cited by examiner

METHOD FOR PRODUCING NANOPARTICLES FOR MAGNETIC FLUIDS BY ELECTRON-BEAM EVAPORATION AND CONDENSATION IN VACUUM, A MAGNETIC FLUID PRODUCING METHOD AND MAGNETIC FLUID PRODUCED ACCORDING TO SAID METHOD

FIELD OF THE INVENTION

The invention relates to producing magnetic fluids and to synthesis of novel materials in vacuum and may be applied in mechanical engineering, medicine, as well as in producing nanoparticles of metals and their oxides.

PRIOR ART

Processes of producing superfine powders by the method of vacuum condensation of metal vapours on substrates heated up to certain temperatures are known, where the conditions of interaction of the atoms and molecules of the metal with the surface have the main role in nanoparticle formation. These are the processes of physical deposition from the vapour phase (PVD).

For instance, the method of producing ultrafine oxide powders by electron beam evaporation of initial substances can be used as the process of producing nanoparticles for magnetic fluids [J. D. Ramsay, R. G. Avery. Ultrafine oxide powder prepared by electron beam evaporation. Part 1 Evaporation and condensation processes. Journal of materials science, 9, 1974, 1681-1688]. This process allows deposition of nanoparticles on the inner surface of a copper water-cooled pipe from a sample of the initial substance, which is placed into the rotating crucible and heated by the electron beam through a slot in the pipe. The pressure and type of gas, which is bled into the chamber, is used to control the structure of the produced nanopowders, which are later scraped off the nickel-plated surface of the copper water-cooled pipe. This method was used to produce nanoparticles of oxides of different metals of $\leq 10$ nm size, which were then injected into the carrier fluid.

However, with this process of producing the nanoparticle a certain aggregation of the particles at their condensation on the substrate is found, which requires additional operations on condensate crushing. Moreover, in production of magnetic nanoparticles additional aggregation develops due to magnetic forces. Therefore, magnetic particles should be produced by their vapour condensation directly in the dispersed medium with simultaneous stabilization. The main feature of this process consists in that both the stages should coincide in time so as to prevent particle coagulation under the impact of the forces of attraction.

The closest by the totality of features to the claimed invention and selected as the closest analog, is the method of producing nanoparticles for magnetic fluids, which consists in evaporation of solid initial material and fixing the nanoparticles of the above material at condensation of its vapours on a cooled substrate by the carrier, which solidifies on the above substrate, disclosed in the Japanese Patent JP 63039631, Hayashi Toyoji, "Production of fine particles of organic substance", which includes vacuum evaporation of organic material solid at 20° C., and its deposition on a cooled recoverable plate simultaneously with a carrier, gaseous or liquid at 20° C., which solidifies on this cooled plate. Then the plate temperature is increased and a highly-dispersed organic material is obtained, which material is dispersed in the carrier and is then removed from the carrier.

The disadvantage of the above process of producing nanoparticles consists in that the nonmagnetic organic nanoparticles are produced by evaporation of the initial organic substance in vacuum, which is performed predominantly using resistive low-temperature heat sources, which do not allow evaporation of high-temperature inorganic magnetic materials. In addition, continuous feeding of gaseous or liquid carrier into the chamber before its solidification on the plate to restore the carrier layer, leads to vacuum degradation, while the process of gradual deposition of the organic substance and carrier does not guarantee prevention of the possible coagulation of particles of the organic substance, which may lead to a considerable widening of the range of the produced particle dimensions. Nor is there any possibility of broad regulation of the dimensions of the organic substance nanoparticles at their deposition on highly cooled plate at constant deposition and solidification of the gaseous or liquid carriers.

The closest by the totality of the main features to the claimed invention and selected as the closest analog to the process of producing magnetic fluid with nanoparticles of specified dimensions and to the magnetic fluid produced by this process, is the method of producing magnetic fluid and the magnetic fluid described in the following publication: Kimoto K., Kamiya Y., Nonoyama M., Uyeda R. // An Electron Microscope Study On Fine Metal Particles Prepared by Evaporation in Argon Gas at Low Pressure. // Jpn. J. Appl. Phys., 1963, V.2, P.702-704. Nakatani I., Furubayashai T., Takanashi T., Hanaoka H. // Preparation and magnetic properties of colloidal ferromagnetic metals. // J. Mag. Mag. Mat., 1987, V.65, #283, P.261-264. The process consists in producing magnetic fluids by electron beam evaporation of metals and vacuum condensation in a dispersed medium, in which the method of vacuum evaporation of metals is combined with their condensation in the liquid. Vapour source was placed in the center of the vacuum chamber, which was a rotating horizontal cylinder. A solution of surfactant (stabilizer) in hydrocarbon liquid with low pressure of saturated vapours was placed on the cylinder bottom. At cylinder rotation a thin film of the liquid formed on its wall, which is where metal vapour condensation proceeded. Stabilizer present in the solution made the particle surface liophylic, which abruptly limited their growth. At chamber rotation, the liquid film saturated by particles was replaced by the new one, which resulted in continuous rising of particle concentration in the liquid. At the velocity of chamber rotation of 2 rpms, and 0.03 Pa pressure in it, the intensity of metal evaporation was up to 0.3 g/min. Application of this method of producing magnetic fluids allowed obtaining quite small particles of metals, namely iron, cobalt and nickel.

The magnetic fluid itself was produced by the following method. For extraction of particles from the obtained colloid the latter was annealed in argon atmosphere for 20 min at the temperature of 270° C. Flocculated particles were separated by centrifuging, and then dispersed again in the liquid in the presence of a surfactant. The described procedure was cumbersome. It, however, allowed producing rather fine metal particles. By the data of electron microscopy particle dimensions were: Fe-3.7 nm, Co-4.8 nm, Ni-7.5 nm. Dimensions of particles produced by other methods were 10-80 nm. This was of principal importance for producing magnetic fluids with good magnetization indices, as coarse particles stabilized poorly in a dispersed environment, and it was not always possible to produce a magnetic colloid of the required quality.

A disadvantage of the above method of producing magnetic fluids and of the fluid proper produced by this method, is a rather low efficiency of fixing the nanoparticle dimensions due to their stabilization by the surfactant in a thin film, because of the absence of convective flows in the fluid and thorough enveloping of the particle by the surfactant, which results in performance of a cumbersome procedure of subsequent treatment of the colloid to produce such fine particles, because the latter is subjected to annealing in argon atmosphere, and then the flocculated particles are separated by centrifuging and again dispersed in the liquid in the presence of a stabilizer. In addition, in its current from, the method has a low efficiency and is unsuitable for a broad-scale fabrication of magnetic fluids, as it is difficult to install in the horizontal rotary pipe a rather large vapour source with electron beam heating, and on the other hand, a considerable increase of the melt surface area can promote evaporation or solidification of a thin liquid film due to a high flow of radiant energy from the heated surface of the melt.

ESSENCE OF THE INVENTION

This invention is aimed at development of a highly efficient process of producing nanoparticles for magnetic fluids by vacuum evaporation and condensation, which allows evaporation of high-temperature inorganic magnetic materials and enables a rigid fixation and control of the size of nanoparticles at their deposition, as well as obtaining a magnetic fluid with controllable dimensions of nanoparticles.

The defined aim is achieved by proposing a method to produce nanoparticles for magnetic fluids by electron beam evaporation and condensation in vacuum which method consists in evaporating an initial solid material and fixing nanoparticles on a cooled substrate by means of a solidifiable carrier during vapour condensation, wherein, according to the invention, a solid inorganic magnetic material selected from a group comprising metals, alloys or oxides thereof is used as the initial material, a solid liquid-soluble material is used as a carrier material for fixing nanoparticles of the magnetic material, a composition of the initial material and the carrier is evaporated simultaneously by electron-beam heating, in said composition the carrier concentration being ranged from 99 to 70%, the vapour is deposited on the substrate, which is cooled to the temperature below the melting point of the carrier material, and the condensate of magnetic material nanoparticles having the specified size and fixed in the solid carrier is obtained, the nanoparticle size being adjusted by said setting of the specified temperature of the substrate during vapour deposition.

Such solution allows to evaporate high-temperature inorganic magnetic materials, condensation of nanoparticles in a solid dispersion medium allows to fix and maintain precisely their dimensions, while variation of substrate temperature allows to control and select the optimum dimensions of the produced nanoparticles. In addition, increase of the volume of evaporated materials, melting power, substrate surface area and duration of evaporation process allows to increase considerably the efficiency of producing the nanoparticles for magnetic fluids manufacture.

A solid inorganic material soluble in the fluid and selected from a group including salts of alkali, alkaline-earth metals and their mixtures should be used preferably as a carrier fixing the magnetic material nanoparticles.

Such solution allows to evaporate the carrier simultaneously with the inorganic magnetic material by the electron beam and thus to fix the size of the magnetic material nanoparticles more accurately, as their condensation on the substrate occurs at the same time. In addition, quite high melting temperatures of these materials allow to heat the substrate in a rather broad temperature range, as well as to control the dimensions of the produced magnetic nanoparticles, which are fixed in a solid carrier. The ability of the carrier material to dissolve in the fluid eliminates the need for combining the stage of producing and stabilization of the nanoparticles and simplifies greatly the process of their extraction from the carrier.

It is rational to extract the magnetic material nanoparticles from the above condensate by its dissolution in at least one fluid and to stabilize them by a surfactant dissolved in said fluid.

Such a solution allows to eliminate a necessity to combine the stage of nanoparticle producing and stabilizing and simplifies greatly the process of their extraction from the carrier, as the nanoparticles stabilized in the solid carrier may be stored for a period of any duration without disturbance of their dimensions, and the stabilization process is carried out at the final stage at condensate dissolution and preparation of the magnetic fluid.

Another aim of the invention is development of a method of producing a magnetic fluid containing nanoparticles of magnetic material of the specified dimensions, which method, due to the use of the dissolution ability of the solid carrier, would ensure preservation of the dimensions of the produced particles at their stabilization by a surfactant at the final stage of their extraction from the solid carrier.

The above aim is achieved by proposing a method of producing a magnetic fluid containing nanoparticles of the specified dimensions, wherein, according to the invention, the magnetic fluid is produced by dissolution in at least one fluid of a condensate of magnetic material nanoparticles of the specified size fixed in the solid carrier, which condensate is produced by simultaneous electron-beam evaporation with subsequent deposition on the substrate, which temperature being set and maintained at a certain level below the temperature of the carrier material melting, of a composition of solid inorganic magnetic material selected from a group including metals, alloys and their oxides, and of a solid carrier, which is soluble in the fluid, fixes the nanoparticles, and is selected from a group of inorganic materials, including the salts of alkali, alkaline-earth metals and their mixtures, and stabilization of the nanoparticles in the above fluid by a surface-active agent dissolved in said fluid.

Such solution, due to dissolution of the solid carrier, in which the size of the produced nanoparticles is fixed by simultaneous condensation of the composition at a certain temperature of the substrate, in the fluid with the dissolved surfactant, which stabilizes the nanoparticles, enables producing a magnetic fluid with fixed nanoparticle dimensions, which are controllable in a broad range.

Finally, the aim of the invention is proposing a magnetic fluid, containing nanoparticles of a magnetic material of the specified dimensions, in which the ability of producing fine nanoparticles without their coagulation at the manufacturing and subsequent storage stages is achieved owing to rigid fixation of the dimensions of the obtained nanoparticles, what was impossible in the prior art.

The posed aim is achieved by proposing a magnetic fluid, which contains nanoparticles of magnetic material of the specified dimensions, which, according to the invention, was produced by the above method.

Such a solution enables producing a magnetic fluid with precisely fixed and specified size of nanoparticles.

BRIEF DESCRIPTION OF DRAWINGS

Technical essence of the claimed invention is explained by the following detailed description and specific examples with reference to appended drawings, wherein:

DETAILED DESCRIPTION OF THE INVENTION

Figure 1:
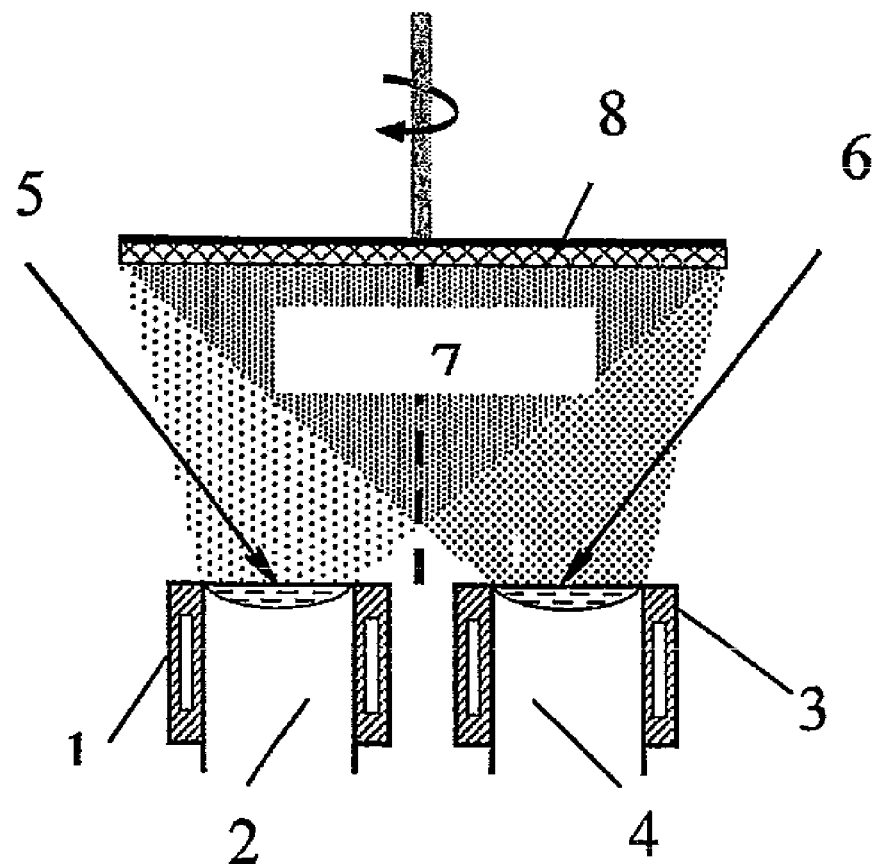
FIG. 1 illustrates the scheme of electron-beam unit for embodiment of the process of producing nanoparticles for magnetic fluid.

A method of producing nanoparticles for magnetic fluid is realized in an electron beam unit. A compacted rod 2 of inorganic magnetic material is placed into one cylindrical water-cooled crucible 1 (FIG. 1), and rod 4 of a solid carrier material soluble in the fluid is placed into another adjacent crucible 3, respectively. A vacuum of the order of $10^2$ Pa is generated in the chamber. The surface of both the rods is heated by electron beam guns 5 and 6 up to melting, which results in forming a mixed vapour flow 7 of the magnetic material and the carrier, which vapour flow is condensed on water-cooled substrate 8, which temperature is maintained at a specified value below the carrier material melting temperature. After a certain operation time, power of electron beam guns 5 and 6 is switched off and the process of evaporation and condensation is completed. As a result, a condensate of such composition is produced on the substrate: magnetic nanoparticles of the specified size fixed in the solid carrier. This condensate can be stored for a long time without coagulation of the nanoparticles.

A method of producing the magnetic fluid consists in the following. A condensate produced on the substrate is dissolved in the initial fluid using ultrasonic treatment. After a certain time the solution with nanoparticles is poured off, leaving a residue with coarse particles, which penetrated here accidentally. The above solution with nanoparticles is treated by a surfactant by means of its dissolving in the initial fluid, or in another fluid at replacement of the carrier base of magnetic fluid. If required, the magnetic fluid during preparation is subjected to centrifuging to separate and increase the yield of a certain fraction.

EXAMPLE 1

A method of producing the nanoparticles for magnetic fluid was embodied in a laboratory-production unit UE-193. A rod 2 of compacted $Fe_3O_4$ of 48.5 mm diameter and 110 mm height was placed into one cylindrical water-cooled crucible 1 of 50 mm inner diameter (FIG. 1) and rod 4 of NaCl was placed into the other adjacent crucible 3, respectively. A vacuum of $1.33-2.6 \times 10^{-2}$ Pa was created in the chamber. The surfaces of both rods were heated by electron beam guns 5 and 6 up to melting, which resulted in formation of mixed vapour flow 7 of $Fe_3O_4$ and NaCl, which was condensed on water-cooled substrate 8 having the temperature of 30° C. After 30 minutes of operation power supply of electron beam guns 5 and 6 was switched off and the process was completed. Evaporation rate of $Fe_3O_4$ was 0.40 g/min, evaporation rate of NaCl was four times higher. As a result, a condensate of a composition of $Fe_3O_4$ nanoparticles in NaCl was produced.

A method of producing the magnetic fluid was implemented using the produced condensate. The condensate from the substrate was dissolved in ionized water using ultrasonic treatment for 1 hour. After 10 min settling, the solution with nanoparticles was poured off, leaving a residue with coarse particles, which penetrated here accidentally. The above solution with nanoparticles was treated by a surfactant, which was dissolved in this solution so as to obtain a magnetic fluid with the specified fixed size of nanoparticles.

Figure 2:
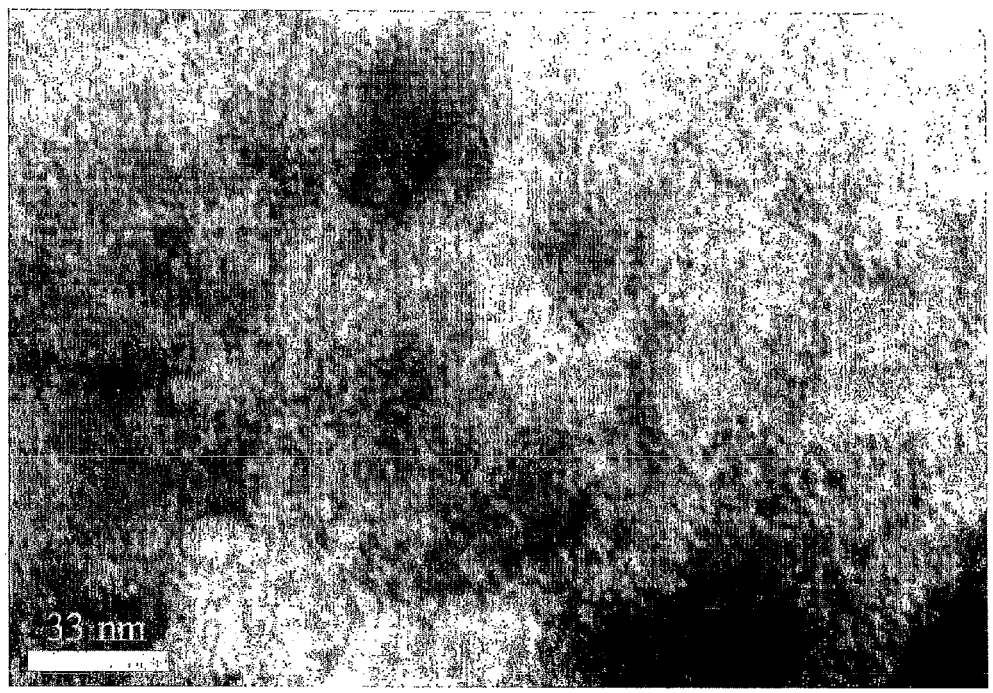
FIG. 2 characterizes the size of nanoparticles produced at substrate temperature of 30° C., and type of compound forming the nanoparticles.
Figure 2:
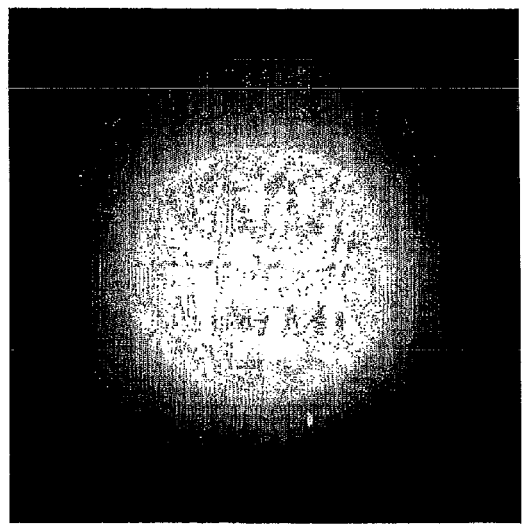

The magnetic fluid itself, which was produced by the above method, was examined to determine the nanoparticle dimensions and type of compound forming the nanoparticles. A drop of the solution with the nanoparticles was dried up and the residue was studied using electron beam microscopy. Particle size was 3-4 nm, the compound forming the nanoparticles was $Fe_3O_4$ (FIG. 2).

EXAMPLE 2

A method of producing the nanoparticles for magnetic fluid was implemented in a laboratory-production unit UE-193. A rod 2 of compacted $Fe_3O_4$ of 48.5 mm diameter and 110 mm height was placed into one cylindrical water-cooled crucible 1 of 50 mm inner diameter (FIG. 1), and rod 4 of KCl was placed into the second adjacent crucible 3, respectively. A vacuum of $1.33-2.6 \times 10^{-2}$ Pa was created in the chamber. The surfaces of both the rods were heated by electron beam guns 5 and 6 up to melting, which resulted in formation of mixed vapour flow 7 of $Fe_3O_4$ and KCl, which was condensed onto a water-cooled substrate 8 having the temperature of 210° C. After 30 minutes of operation, power of electron beam guns 5 and 6 was switched off, and the process was completed. $Fe_3O_4$ evaporation rate was equal to 0.45 g/min, and KCl evaporation rate was 4.5 times higher. As a result, a condensate of the composition of $Fe_3O_4$ particles in KCl was produced.

A method of producing the magnetic fluid was implemented using the produced condensate. The condensate from the substrate was dissolved in ionized water using ultrasonic treatment for 1.5 hours. After settling for 12 minutes, the solution with nanoparticles was poured off, leaving a residue with coarse particles, which penetrated there accidentally. The above solution with the nanoparticles was treated by a surfactant, which was dissolved in this solution, so as to obtain a ready magnetic fluid with the specified fixed dimensions of nanoparticles.

Figure 3:
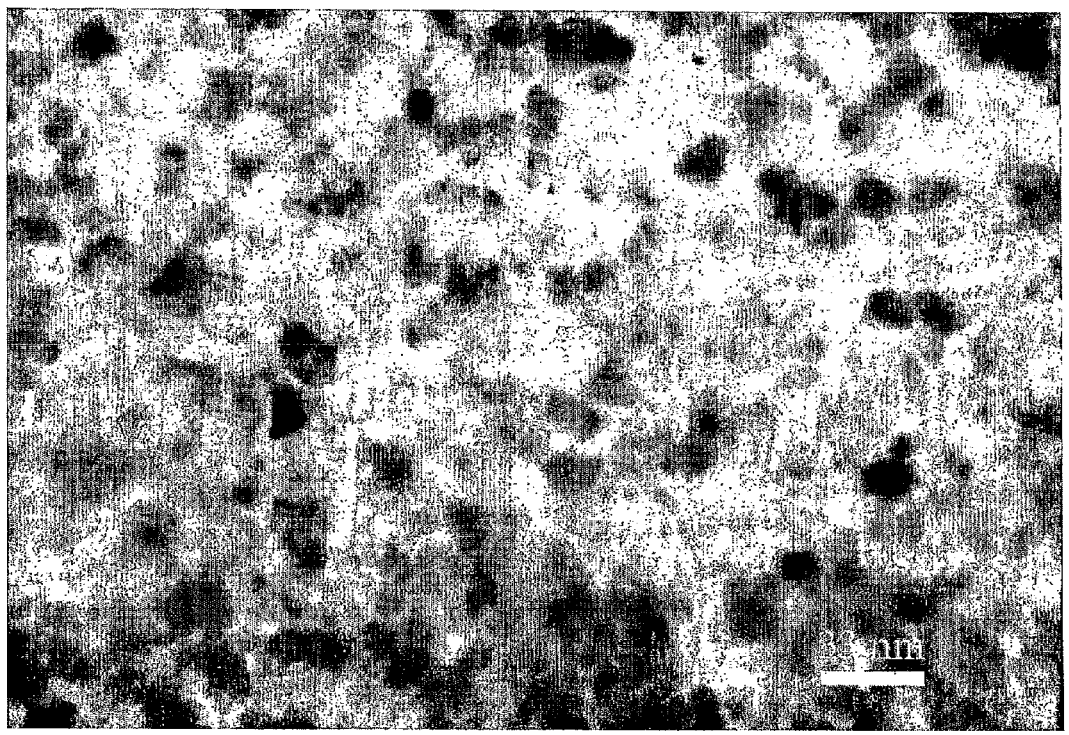
FIG. 3 characterizes the size of nanoparticles produced at substrate temperature of 210° C., and type of compound forming the nanoparticles.
Figure 3:
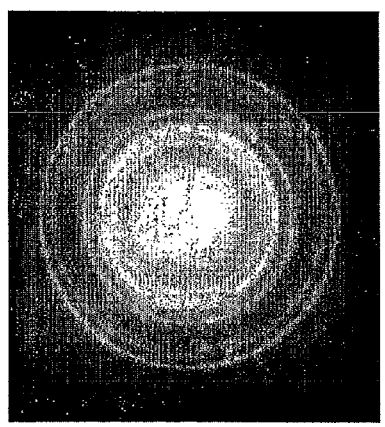

The magnetic fluid proper produced by this method, was studied to determine the dimensions of nanoparticles and type of compound forming the nanoparticles. A drop of the solution with the nanoparticles was dried up, and the residue was examined using electron microscopy. Particle dimensions were equal to 10-14 nm, the compound forming the nanoparticles was $Fe_3O_4$ (FIG. 3).

Results of other examples of producing $Fe_3O_4$ nanoparticles are given in the Table.

TABLE

| Example | Evaporation substance | Evaporation rate, g/min | Evaporation time, min | Dispersion medium | Substrate temperature, ° C. | Average nanoparticle size, nm |
|---|---|---|---|---|---|---|
| 3 | $Fe_3O_4$ | 0.38 | 30 | NaCl | 82 | 5-7 |
| 4 | $Fe_3O_4$ | 0.41 | 30 | NaCl | 160 | 9-12 |
| 5 | $Fe_3O_4$ | 0.40 | 30 | NaCl | 230 | 11-16 |

TABLE-continued

| Example | Evaporation substance | Evaporation rate, g/min | Evaporation time, min | Dispersion medium | Substrate temperature, °C. | Average nanoparticle size, nm |
|---|---|---|---|---|---|---|
| 6 | $Fe_3O_4$ | 0.37 | 30 | KCl | 33 | 3-4 |
| 7 | $Fe_3O_4$ | 0.42 | 30 | KCl | 75 | 4-7 |
| 8 | $Fe_3O_4$ | 0.39 | 30 | KCl | 155 | 8-12 |
| 9 | $Fe_3O_4$ | 0.41 | 30 | KCl | 220 | 11-15 |

From the Table it can be seen that nanoparticle condensation in a solid dispersion medium allows precise fixation and preservation of their dimensions. On the other hand, variation of substrate temperature allows to control and select optimum dimensions of the produced nanoparticles. Increase of melting crucible diameter, melting power, substrate surface area and duration of the evaporation process allow a significant increase of the efficiency of producing the nanoparticles for manufacturing magnetic fluids.

INDUSTRIAL APPLICABILITY

The claimed method of producing nanoparticles for magnetic fluids by electron beam evaporation and condensation in vacuum can be embodied by technically simple techniques in the existing equipment for electron beam evaporation of metals and alloys, and does not require any particularly expensive devices. On the other hand, the claimed method of producing magnetic fluids by electron beam evaporation and condensation in vacuum and the magnetic fluids produced by this method can satisfy the requirement of the medical industry of Ukraine for magnetic fluids for medicines, as well as the demand of mechanical engineering sector for commercial liquid magnetic media.

By proxy

The invention claimed is:

1. A method for producing nanoparticles for magnetic fluids by electron beam evaporation and condensation in a vacuum, said method comprising the steps of:
    evaporating an initial solid inorganic magnetic material selected from the group comprising metals, alloys or oxides thereof;
    evaporating a carrier made of a solid liquid-soluble material simultaneously with said evaporation of the initial solid inorganic magnetic material by electron-beam heating, the carrier concentration being in the range of from 99 to 70% in a total mixed vapor of the initial solid inorganic magnetic material and the solid liquid-soluble material; and
    depositing the mixed vapor on a substrate, the step of depositing the vapor on the substrate including:
        fixing magnetic nanoparticles of the solid inorganic magnetic material during condensation of the mixed vapor on a cooled substrate by solidifying the solid liquid-soluble material on the substrate;
        adjusting a nanoparticle size by presetting and maintaining the temperature at a specified value below the melting point of the solid liquid-soluble material during deposition of the mixed vapor;
        obtaining a condensate of the magnetic nanoparticles having a specified size, fixed in the carrier.

2. The method according to claim 1, further comprising the step of using a solid liquid-soluble inorganic material selected from a group containing salts of alkali and alkali-earth metals and mixtures thereof as the solid liquid-soluble material of the carrier fixing the magnetic nanoparticles of the magnetic material.

3. The method according to claim 1, further comprising the steps of:
    extracting the magnetic nanoparticles from said condensate by diluting the condensate in at least one type of liquid; and
    stabilizing the magnetic nanoparticles by a surface-active agent dissolved in said liquid.

4. A method of producing a magnetic fluid containing nanoparticles of a magnetic material of a specified size, comprising the steps of:
    evaporating an initial solid inorganic magnetic material selected from the group comprising metals, alloys or oxides thereof;
    evaporating a carrier made of a solid liquid-soluble material simultaneously with said evaporation of the initial solid material by electron-beam heating, the carrier concentration being in the range of from 99 to 70% in a total mixed vapor of the initial solid inorganic magnetic material and the solid liquid-soluble material;
    using a solid liquid-soluble inorganic material selected from a group containing salts of alkali and alkali-earth metals and mixtures thereof as the solid liquid-soluble material of the carrier fixing magnetic nanoparticles of the magnetic material; and
    depositing the mixed vapor on a substrate, the step of depositing the vapor on the substrate including:
        fixing the magnetic nanoparticles of the solid inorganic magnetic material during condensation of the mixed vapor on a cooled substrate by solidifying the solid liquid-soluble material on the substrate;
        adjusting a nanoparticle size by presetting and maintaining the temperature at a specified value below the melting point of the solid liquid-soluble material during deposition of the mixed vapor;
        obtaining a condensate of the magnetic nanoparticles having a specified size, fixed in the carrier;
        extracting the magnetic nanoparticles from the condensate by diluting the condensate in at least one type of liquid; and
        stabilizing the magnetic nanoparticles in a fluid by a surface-active agent dissolved in said fluid thereby attaining the magnetic fluid containing the magnetic nanoparticles.

5. A magnetic fluid containing the nanoparticles of the magnetic material of the specified size, wherein the magnetic fluid is produced by the method according to claim 4.

* * * * *